US012414247B2

(12) United States Patent
Guo et al.

(10) Patent No.: US 12,414,247 B2
(45) Date of Patent: Sep. 9, 2025

(54) ASSEMBLY FOR DISPLAY MODULE, DISPLAY MODULE AND SPLICED DISPLAY APPARATUS

(71) Applicants: BOE MLED Technology Co., Ltd., Beijing (CN); BOE TECHNOLOGY GROUP CO., LTD., Beijing (CN)

(72) Inventors: Shaofei Guo, Beijing (CN); Shipeng Wang, Beijing (CN); Zhonghua Li, Beijing (CN); Dongjia Hao, Beijing (CN); Yiping Ruan, Beijing (CN)

(73) Assignees: BOE MLED Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/016,413

(22) PCT Filed: Jan. 7, 2022

(86) PCT No.: PCT/CN2022/070653
§ 371 (c)(1),
(2) Date: Jan. 16, 2023

(87) PCT Pub. No.: WO2023/130342
PCT Pub. Date: Jul. 13, 2023

(65) Prior Publication Data
US 2024/0251512 A1   Jul. 25, 2024

(51) Int. Cl.
*H05K 5/02* (2006.01)
*G09F 9/302* (2006.01)
*H05K 5/30* (2025.01)

(52) U.S. Cl.
CPC ......... *H05K 5/0217* (2013.01); *G09F 9/3026* (2013.01); *H05K 5/30* (2025.01)

(58) Field of Classification Search
CPC ....... G09F 9/3026; G09F 9/33; H05K 5/0217; H05K 5/0021; H05K 5/30; H05K 5/0052; G02F 1/13336
See application file for complete search history.

(56) References Cited

U.S. PATENT DOCUMENTS 3,498,653 A * 3/1970 McCreery ................. F16B 1/00
403/322.2
4,274,460 A * 6/1981 Egner ................... F16B 35/048
411/353

(Continued)

FOREIGN PATENT DOCUMENTS

| CN | 107610610 A | 1/2018 |
| CN | 208315100 U | 1/2019 |

(Continued)

*Primary Examiner* — Allen L Parker
*Assistant Examiner* — Martin Antonio Asmat Uceda
(74) *Attorney, Agent, or Firm* — HOUTTEMAN LAW LLC

(57) ABSTRACT

An assembly for a display module, a display module and a spliced display apparatus are disclosed. The assembly is used for assembling with one or more positioning posts, and includes: a support structure provided with a bearing surface and a mounting surface opposite to each other, wherein the bearing surface is used for bearing the display substrate; one or more fasteners on the mounting surface of the support structure, wherein an accommodating cavity is provided in each fastener and includes a first opening in a surface of the fastener away from the support structure; and one or more clamping modules, each of which is in a corresponding accommodating cavity and used for clamping a corresponding positioning post entering into a corresponding accommodating cavity through a corresponding first opening.

19 Claims, 11 Drawing Sheets

(56) References Cited

U.S. PATENT DOCUMENTS

| | | | | |
|---|---|---|---|---|
| 6,550,830 B2* | 4/2003 | Kueznel | | G09F 3/037 |
| | | | | 292/307 R |
| 7,373,747 B1* | 5/2008 | Wiemer | | G09F 7/00 |
| | | | | 40/605 |
| 8,007,121 B2* | 8/2011 | Elliott | | G09F 9/33 |
| | | | | 362/147 |
| 8,295,534 B2* | 10/2012 | Hamada | | H04R 1/025 |
| | | | | 381/388 |
| 8,720,874 B2* | 5/2014 | Tschida | | F16B 19/109 |
| | | | | 269/48.1 |
| 8,910,804 B2* | 12/2014 | Kim | | F16M 11/10 |
| | | | | 211/87.01 |
| 9,082,325 B2* | 7/2015 | Davis | | E04G 1/152 |
| 9,222,280 B2* | 12/2015 | Mackle | | E05B 15/0205 |
| 9,712,780 B1* | 7/2017 | Oya | | F16M 11/2092 |
| 10,372,401 B2* | 8/2019 | Ryu | | G09F 9/3026 |
| 10,495,255 B2* | 12/2019 | Brashnyk | | G09F 9/3026 |
| 10,522,519 B2* | 12/2019 | Ryu | | H01L 25/0753 |
| 10,999,940 B2* | 5/2021 | Kludt | | H05K 5/30 |
| 11,125,259 B2* | 9/2021 | Hassounah | | B23P 19/10 |
| 11,528,815 B2* | 12/2022 | Lee | | G09F 9/33 |
| 12,078,285 B2* | 9/2024 | Choi | | F16M 11/046 |
| 2002/0074811 A1* | 6/2002 | Kuenzel | | G09F 3/037 |
| | | | | 292/137 |
| 2009/0284978 A1* | 11/2009 | Elliott | | G09F 9/33 |
| | | | | 362/382 |
| 2016/0210886 A1* | 7/2016 | Brashnyk | | F16M 11/121 |
| 2017/0127538 A1* | 5/2017 | Westhoff | | G09F 9/3026 |
| 2019/0026062 A1* | 1/2019 | Seo | | G06F 3/1446 |
| 2019/0191577 A1 | 6/2019 | Declerck et al. | | |
| 2024/0260202 A1* | 8/2024 | Cho | | G02F 1/133314 |

FOREIGN PATENT DOCUMENTS

| | | | |
|---|---|---|---|
| CN | 110491303 A | * | 11/2019 |
| CN | 112233578 A | | 1/2021 |
| CN | 214476147 U | | 10/2021 |
| CN | 214476174 U | | 10/2021 |
| CN | 215214215 U | | 12/2021 |
| CN | 216212071 U | | 4/2022 |

* cited by examiner

ASSEMBLY FOR DISPLAY MODULE, DISPLAY MODULE AND SPLICED DISPLAY APPARATUS

TECHNICAL FIELD

The present disclosure relates to the field of display technology, and in particular to an assembly for a display module, a display module and a spliced display apparatus.

BACKGROUND

A micro inorganic light-emitting diode (LED) includes Mini-LED and Micro-LED, wherein the Mini-LED is a light-emitting diode (LED) chip with a die size of about 100 microns to 300 microns. The Micro-LED is a light-emitting diode (LED) chip with a die size of being less than 100 microns. A display apparatus adopting Mini-LED/Micro-LED has advantages of a low power consumption, a high brightness, a high resolution, a high color saturation, a fast response, a long service life, a high efficiency and the like. In addition, a plurality of display apparatus adopting Mini-LED/Micro-LED can be seamlessly spliced together, an oversized display product is formed, which has a wide application prospect in the large-size display field, such as a command monitoring center, a business center, a high-end conference, a cinema, or the like.

SUMMARY

The present disclosure provides an assembly for a display module, a display module and a spliced display apparatus.

The present disclosure provides an assembly for a display module for assembling with one or more positioning posts, wherein the assembly includes: a support structure provided with a bearing surface and a mounting surface opposite to each other, wherein the bearing surface is used for bearing the display substrate; one or more fasteners on the mounting surface of the support structure, wherein an accommodating cavity is provided in each fastener and includes a first opening in a surface of the fastener away from the support structure; and one or more clamping modules, each of which is in a corresponding accommodating cavity and used for clamping a corresponding positioning post entering into a corresponding accommodating cavity through a corresponding first opening.

In some embodiments, each accommodating cavity includes: a first accommodating part for accommodating a part of a corresponding positioning post; and a plurality of slide parts distributed in a circumferential direction of a corresponding first accommodating part and connected to the first accommodating part; each of the one or more clamping module includes: a plurality of elastic members; wherein one elastic member is provided in each slide part; and each elastic member is configured to stretch out and draw back in a thickness direction of the support structure, and has a first state and a second state; a length of each elastic member in the first state is greater than that of the elastic member in the second state; and a plurality of limiting members connected to the plurality of elastic members in a one-to-one correspondence; wherein each limiting member is on a side of a corresponding elastic member away from the support structure, and is configured to limit a corresponding positioning post in the thickness direction of the support structure in cooperation with a limiting structure on the positioning post when a corresponding elastic member is in the first state; and is configured to be separated from the limiting structure when the elastic member is in the second state.

In some embodiments, each positioning post is a screw, and each limiting structure is a first thread on each positioning post; a second thread is arranged on a surface of each limiting member close to a corresponding first accommodating part; each slide part includes a first side wall opposite to a corresponding first accommodating part; each first side wall is gradually close to a corresponding first accommodating part in a direction away from the support structure, so that each limiting member abuts against an end of a corresponding first side wall away from the support structure, when a corresponding elastic member is in the first state, and the first thread is engaged with the second thread.

In some embodiments, each limiting feature is a groove in each positioning post; each accommodating cavity further includes: a second accommodating part on a side of a corresponding first accommodating part away from the support structure, and having a second opening, a third opening, and a side wall connected therebetween; the second opening is connected to the first accommodating part and corresponding slide parts, and the third opening is connected to a corresponding first opening; wherein a cross-sectional area of each second accommodating part gradually decreases in a direction away from the support structure, so that a corresponding limiting member abuts against the side wall of the second accommodating part and at least partially enters into a corresponding groove when a corresponding elastic member is in the first state.

In some embodiments, each limiting member has a spherical shape.

In some embodiments, a plurality of spacers are provided in each second accommodating part, and divide the second accommodating part into: a central accommodating sub-part opposite to and connected to a corresponding first accommodating part, and a plurality of edge accommodating sub-parts opposite to and connected to corresponding slide parts in a one-to-one correspondence.

In some embodiments, each limiting member is a magnet or is attractable by a magnet.

In some embodiments, each fastener includes: a cylindrical structure connected to the support structure; a cap portion on a side of the cylindrical structure away from the support structure, wherein each cap portion is connected to a corresponding cylindrical structure, and encloses an accommodating cavity together with a corresponding cylindrical structure and the support structure, and a first opening of the accommodating cavity is in the cap portion.

In some embodiments, each cylindrical structure and the support structure are formed as a one-piece structure; and each cap portion is detachably connected to a corresponding cylindrical structure.

In some embodiments, the support structure is a rectangular structure, each corner of which is provided with one fastener and one clamping module.

The embodiment of the present disclosure further provides a display module, including: a display substrate and the above assembly; wherein the display substrate is on a side of the support structure of the assembly away from the one or more fasteners.

The embodiment of the present disclosure further provides a spliced display apparatus, including: a box body and a plurality of the above display modules; wherein the one or more positioning posts are on a side of the box body close to the plurality of display modules, a part of each positioning post enters into a corresponding accommodating cavity through a corresponding first opening, and a corresponding clamping module clamps the positioning post.

In some embodiments, each positioning post include: a main body portion connected to the box body; and a mounting head portion on a side of the main body portion away from the box body and is fixedly connected to the main body portion; wherein a cross-sectional area of the mounting head portion decreases in a direction away from the main body portion.

In some embodiments, each positioning post is in a threaded connection with the box body, the spliced display apparatus further includes: a driver on the box body, wherein the driver is connected to each positioning post and configured to drive each positioning post to rotate around an axis of the positioning post according to a driving signal.

In some embodiments, an adjusting passage is provided in each positioning post, and penetrates through the positioning post in a height direction of the positioning post; and a regulating stem is provided in each adjusting passage, and is in a threaded connection with a corresponding positioning post.

In some embodiments, the spliced display apparatus further includes: a driver on the box body, wherein the driver is connected to each regulating stem and configured to drive each regulating stem to rotate around an axis of the regulating stem according to a driving signal.

In some embodiments, each positioning post is provided with the limiting structure, and the limiting structure is a groove, and an orthographic projection of the groove on the box body is annular.

BRIEF DESCRIPTION OF DRAWINGS

The accompanying drawings, which are provided for further understanding of the present disclosure and constitute a part of this specification, are for explaining the present disclosure together with the embodiments of the present disclosure, but are not intended to limit the present disclosure. In the drawings.

DETAIL DESCRIPTION OF EMBODIMENTS

Figure 1:
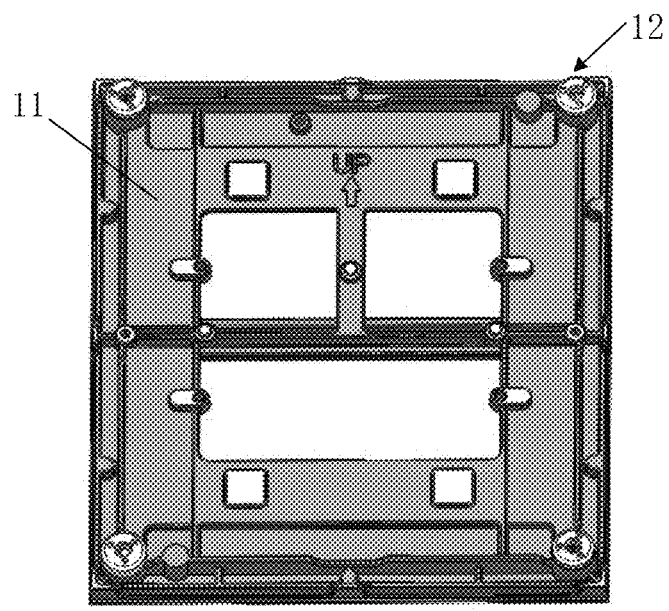
FIG. 1 is a schematic diagram of an assembly for a display module provided in some embodiments of the present disclosure.

The detailed description of the present disclosure will be described more fully hereinafter with reference to the accompanying drawings. It should be understood that the detailed description is only used to illustrate and explain the present disclosure, not to limit the present disclosure.

In order to make the objects, technical solutions and advantages of the embodiments of the present disclosure more apparent, the technical solutions of the embodiments of the present disclosure will be clearly and completely described below with reference to the drawings of the embodiments of the present disclosure. It is apparent that the described embodiments are only some, but not all, embodiments of the present disclosure. All other embodiments, which can be derived by a person skilled in the art from the described embodiments of the present disclosure without inventive step, fall within the scope of protection of the present disclosure.

Terms used herein to describe embodiments of the present disclosure are not intended to limit and/or define the scope of the present disclosure. For example, unless defined otherwise, technical or scientific terms used herein shall have the ordinary meaning as understood by one of ordinary skill in the art to which the present disclosure belongs. It should be noted that the terms "first", "second", and the like used in the present disclosure are not intended to indicate any order, quantity, or importance, but rather are used for distinguishing one element from another. Further, the singular form "a", "an", "the", or the like used herein does not denote a limitation of quantity, but rather denotes the presence of at least one element, unless the context clearly dictates otherwise. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

A box body is used for bearing at least one display module, including: an assembly and a display substrate; the assembly is mounted on the box body; the display substrate is fixed on a side of the assembly away from the box body; the display substrate includes a base substrate and a light-emitting device arranged on the base substrate; and the light-emitting device may include a micro inorganic light-emitting diode. Further, at least two box bodies are adjacently arranged, and each box body bears at least one display module, forming a spliced display apparatus.

In the related art, the assembly is mounted on the box body in a magnetic attraction way. Specifically, the assembly is provided with first magnetic members; the box body is provided with second magnetic members; and the first magnetic members are attracted and connected to the second magnetic members in a one-to-one correspondence. The first magnetic members and the second magnetic members may be magnetic screws. However, in the magnetic attraction way, when mounting the display module and the box body, an instantaneous attraction force can be produced between the display module and the box body, so that the display module is easily bumped. Particularly, when a material of the base substrate is glass or quartz, an edge of the base substrate is bumped more easily, thereby reducing the yield of the display module.

Figure 2:
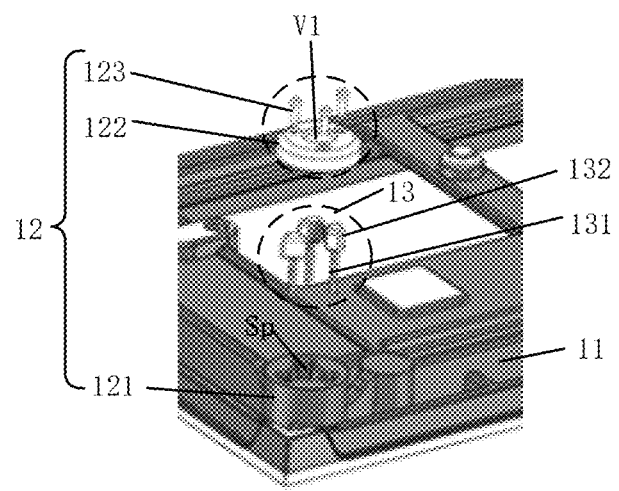
FIG. 2 is a partially exploded view of an assembly provided in some embodiments of the present disclosure.
Figure 3:
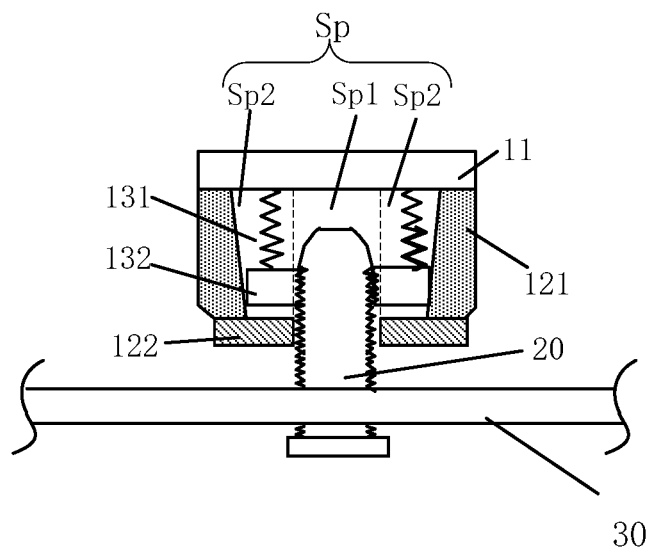
FIG. 3 is a schematic diagram illustrating fitting of a clamping module and a positioning post provided in some embodiments of the present disclosure.

The embodiment of the present disclosure provides an assembly for a display module applied in a spliced display apparatus, a positioning post is arranged on a box body for bearing the display module, and the positioning post may be in a threaded connection with the box body. The assembly for the display module is connected to the positioning post. FIG. 1 is a schematic diagram of an assembly for a display module provided in some embodiments of the present disclosure. FIG. 2 is a partially exploded view of an assembly provided in some embodiments of the present disclosure. FIG. 3 is a schematic diagram illustrating the fitting of a clamping module and a positioning post provided in some embodiments of the present disclosure. As shown in FIGS. 1 to 3, the assembly for the display module includes: a support structure 11 and one or more fasteners 12; as shown in FIG. 2, the assembly further includes one or more clamping modules 13.

The support structure 11 has a bearing surface and a mounting surface opposite to each other, wherein the bearing surface is used for bearing the display substrate, and the mounting surface is opposite to the box body. Each fastener 12 is arranged on the mounting surface of the support structure 11; and an accommodating cavity Sp is formed in each fastener 12 and has a first opening V1 located in a surface of the fastener 12 away from the support structure 11, that is, the first opening V1 faces the box body. Each clamping module 13 is disposed in a corresponding accommodating cavity, and is used for clamping a corresponding positioning post 20 entering into the accommodating cavity Sp through the first opening V1.

In the embodiment of the present disclosure, the clamping modules 13 can clamp the positioning posts 20, so that the assembly for the display module is connected to the positioning posts 20 on the box body 30, and further, the display module is connected to the box body 30. Compared with the magnetic attraction way, such the clamping way cannot produce the instantaneous attraction force when mounting, so that a probability that the display module is bumped can be reduced, and a yield of a spliced display apparatus can be improved.

In some embodiments, a plurality of fasteners 12 and a plurality of clamping modules 13 are disposed on the assembly for the display module, so as to achieve a stable connection between the display module and the box body 30. For example, the support structure 11 has a rectangular structure, each corner of which is provided with one fastener 12 and one clamping module 13.

In some embodiments, in conjunction with FIGS. 2 and 3, each fastener 12 includes: a cylindrical structure 121 and a cap portion 122. The cylindrical structure 121 is connected to the support structure 11. For example, the cylindrical structure 121 and the support structure 11 are formed as a one-piece structure. The cap portion 122 is located on a side of the cylindrical structure 121 away from the support structure 11, and the cap portion 122 is connected to the cylindrical structure 121, wherein the cap portion 122 may be detachably connected to the cylindrical structure 121 by a connector such as a screw 123. Each cap portion 122, a corresponding cylindrical structure 121, and the support structure 11 together enclose one accommodating cavity Sp, and a first opening V1 of the accommodating cavity Sp is located in the cap portion 122. That is, when mounting the assembly and the box body 30, a part of each positioning post 20 on the box body 30 passes through a corresponding cap portion 122 into a corresponding accommodating cavity Sp.

Figure 4:
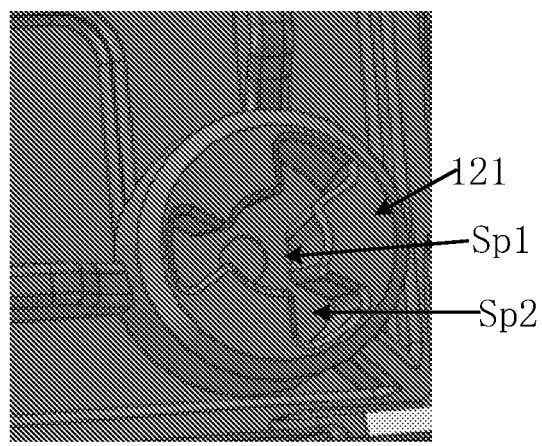
FIG. 4 is a perspective view of a cylindrical structure provided in some embodiments of the present disclosure.
Figure 5:
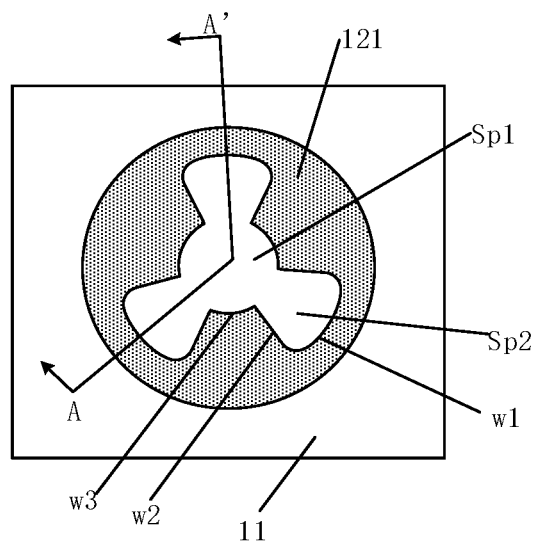
FIG. 5 is a bottom view of a cylindrical structure provided in some embodiments of the present disclosure.
Figure 6:
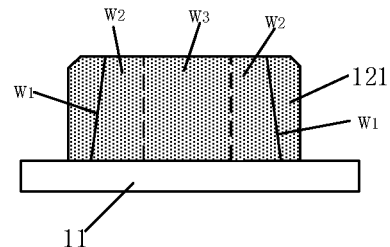
FIG. 6 is a cross-sectional view taken along a line A-A' of FIG. 5.
Figure 7:
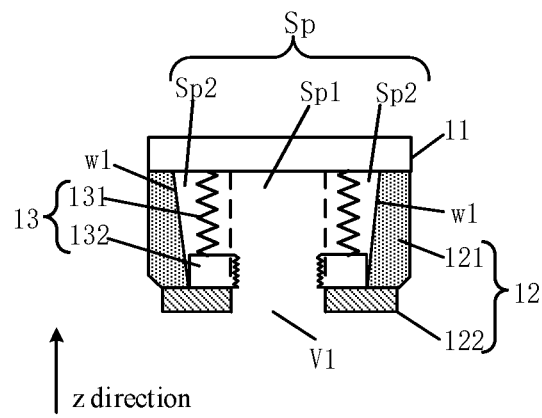
FIG. 7 is a schematic diagram of a fastener and a clamping module provided in some embodiments of the present disclosure.

FIG. 4 is a perspective view of a cylindrical structure provided in some embodiments of the present disclosure. FIG. 5 is a bottom view of a cylindrical structure provided in some embodiments of the present disclosure. FIG. 6 is a cross-sectional view taken along a line A-A' of FIG. 5. FIG. 7 is a schematic diagram of a fastener and a clamping module provided in some embodiments of the present disclosure. As shown in FIGS. 4 to 6, each accommodating cavity Sp includes: a first accommodating part Sp1 and a plurality of slide parts Sp2; the first accommodating part Sp1 may be formed on a corresponding cylindrical structure 121 for accommodating a part of a corresponding positioning post 20. The plurality of slide parts Sp2 are uniformly distributed in a circumferential direction of a corresponding first accommodating part Sp1, and are connected to the first accommodating part Sp1, and are used for accommodating a corresponding clamping module 13.

As shown in FIG. 7, each clamping module 13 includes: a plurality of elastic members 131 and a plurality of limiting members 132. In one example, each clamping module 13 may include three elastic members 131 and three limiting members 132, so as to stably clamp a corresponding positioning post 20 entering into a corresponding accommodating cavity Sp. Alternatively, each clamping module 13 may include other numbers of elastic members 131 and other numbers of limiting members.

Each slide part Sp2 is provided with one elastic member 131 configured to stretch out and draw back in a thickness direction (hereinafter referred to as a z direction) of the support structure 11. Each elastic member 131 has an initial state, a first state, and a second state. The initial state is a state of the elastic member 131 when a corresponding positioning post 20 does not enter into a corresponding accommodating cavity Sp. A length of each elastic member 131 in the first state is greater than that of the elastic member 131 in the second state, and a length of the elastic member 131 in the initial state is greater than or equal to that of the elastic member 131 in the first state. For example, the initial state, the first state and the second state are states when the elastic member 131 is compressed, and a compression amount of the elastic member 131 in the first state is less than that of the elastic member 131 in the second state. In this case, one end of the elastic member 131 away from a corresponding limiting member 132 may or may not be connected to the support structure 11. Assuming that the elastic member 131 is not connected to the support structure 11, when the elastic member 131 is in the initial state, the elastic member 131 and a corresponding limiting member 132 are clamped between the support structure 11 and a corresponding cap portion 122 under the action of the elastic force of the elastic member 131, which can still ensure the stability of the elastic member 131. In the embodiment of the present disclosure, the elastic member 131 may be a spring, such as a compression spring.

The limiting members 132 are connected to the elastic members 131 in a one-to-one correspondence; each limiting member 132 is disposed on a side of a corresponding elastic member 131 away from the support structure 11, and is configured to limit a corresponding positioning post 20 in the z direction in cooperation with a limiting structure on the positioning post 20 when a corresponding elastic member 131 is in the first state; and is configured to be separated from the limiting structure when a corresponding elastic member 131 is in the second state, so that the positioning post 20 is not limited.

Figure 8:
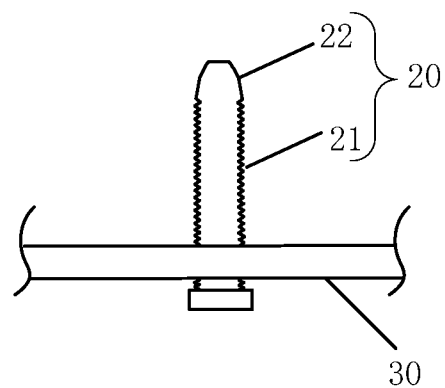
FIG. 8 is a schematic diagram of a positioning post on a box body provided in some embodiments of the present disclosure.

FIG. 8 is a schematic diagram of a positioning post on a box body provided in some embodiments of the present disclosure. As shown in FIG. 8, in some embodiments, each positioning post 20 is a screw, and includes a main body portion 21 and a mounting head portion 22, where the main body portion 21 is provided with a first thread, and the mounting head portion 22 is located on a side of the main body portion 21 away from the box body 30 and is fixedly connected to the main body portion 21. For example, the mounting head portion 22 and the main body portion 21 have a one-piece structure. A cross-sectional area of the mounting head portion 22 decreases in a direction away from the main body portion 21, so that a corresponding limiting member 132 easily enters into a corresponding accommodating cavity Sp when a corresponding elastic member 131 is in the initial state.

When each positioning post 20 is a screw, the limiting structure is the first thread on the positioning post 20. In this case, a second thread is provided on a surface of each limiting member 132 close to a corresponding first accommodating part Sp1, and a cross-sectional area of each slide part Sp2, which is an area of a cross section of the slide part Sp2 perpendicular to a thickness direction of the support structure 11, gradually decreases in a direction away from the support structure 11. That is, the slide part Sp2 gradually contracts in the direction away from the support structure 11. Specifically, as shown in FIG. 5, each slide part Sp2 includes: a first side wall w1, second side walls w2 and a third side wall w3, wherein the plurality of first side walls w1 have a shape conforming to a shape of a part of an outer surface of a corresponding cylindrical structure 121, and are closest to the outer surface of the cylindrical structure 121; the plurality of third side walls w3 surround a corresponding first accommodating part Sp1 and are spaced apart from each other; and the plurality of second side walls w2 are used for connecting corresponding first side walls w1 and corresponding third side walls w3. As shown in FIGS. 6 and 7, in the direction away from the support structure 11, each first side wall w1 gradually approaches the first accommodating part Sp1, so that a corresponding limiting member 132 abuts against one end of each first side wall w1 away from the support structure 11 when a corresponding elastic member 131 is in the first state, and the first thread is engaged with the second thread; when a corresponding elastic member 131 is in the second state, a corresponding limiting member 132 is located at a position where a corresponding slide portion Sp2 is close to the support structure 11, and the thread of the limiting member 132 is not engaged with the thread on a corresponding positioning post 20, so that the positioning post 20 is not limited.

In some embodiments, when each positioning post 20 is a screw, the plurality of limiting members 132 in FIG. 7 are block-shaped, and each of the plurality of limiting members 132 can be regarded as being formed by cutting a nut matched with the positioning post 20.

In some embodiments, each limiting member 132 may be a magnet, or may be attracted by a magnet, so as to facilitate the dismounting and mounting of the support structure 11 of the display module and a corresponding positioning post 20. The dismounting and mounting of the support structure 11 of the display module and a corresponding positioning post 20 will be described below by taking each limiting member 132 being a magnet (for example, the limiting member 132 is made of iron) as an example.

Figure 9A:
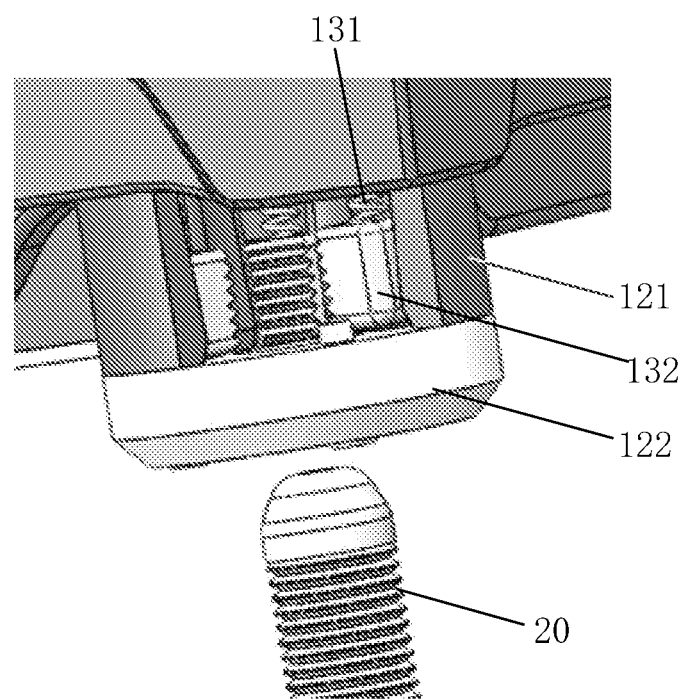
FIGS. 9A to 9C are perspective views illustrating a process for mounting a support structure and a positioning post.
Figure 9B:
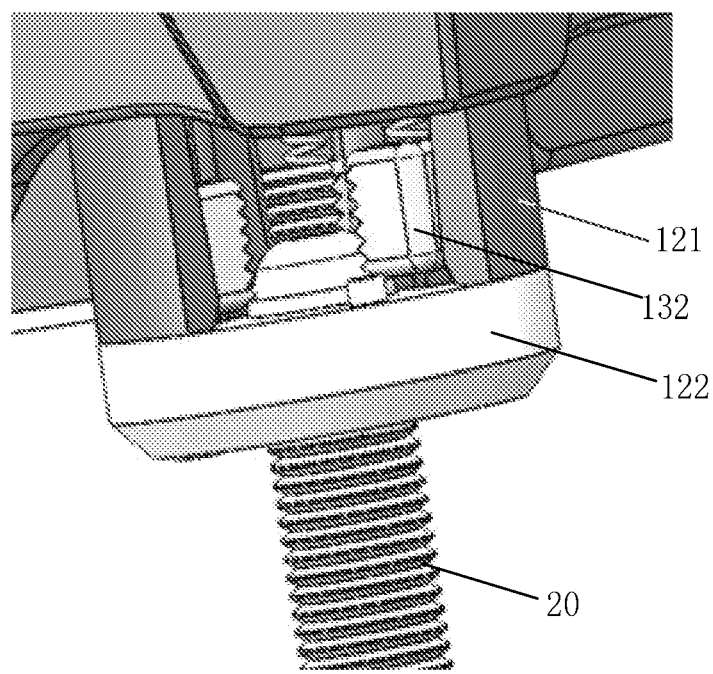
Figure 9C:
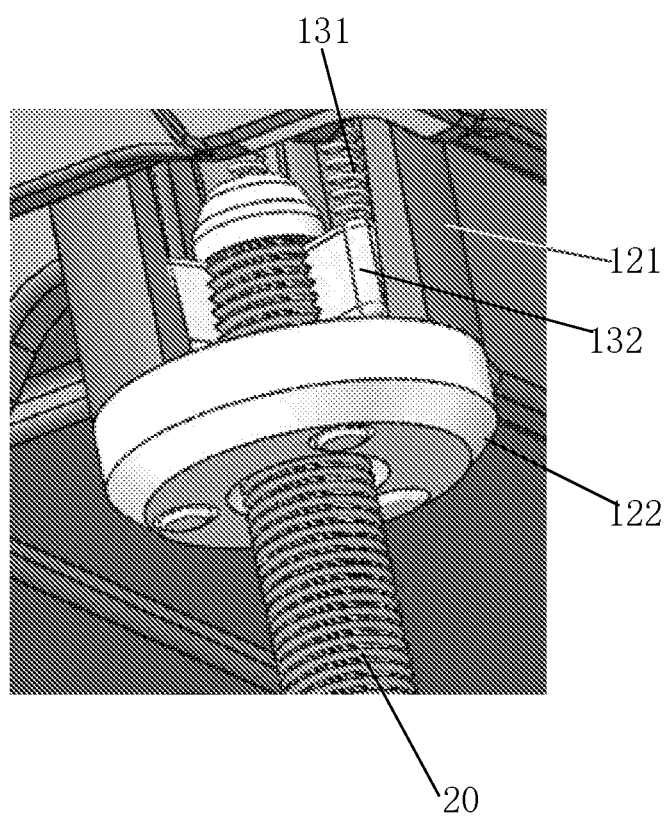
Figure 9D:
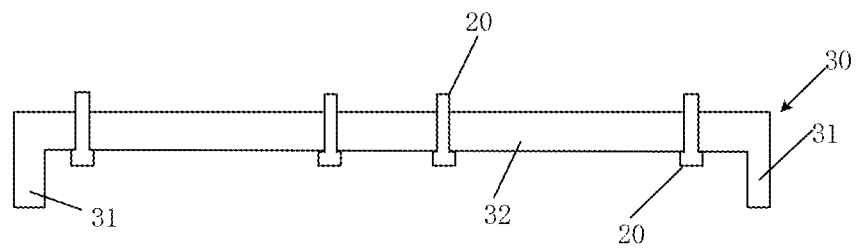
FIG. 9D is a schematic diagram of a box body and positioning posts thereon.
Figure 10A:
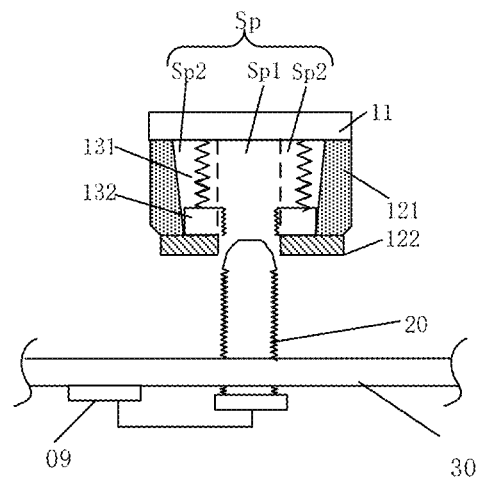
FIGS. 10A to 10C are cross-sectional views illustrating a process of mounting a support structure and a positioning post.
Figure 10B:
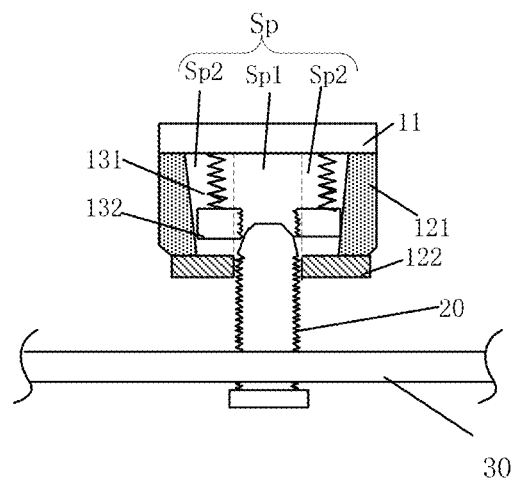
Figure 10C:
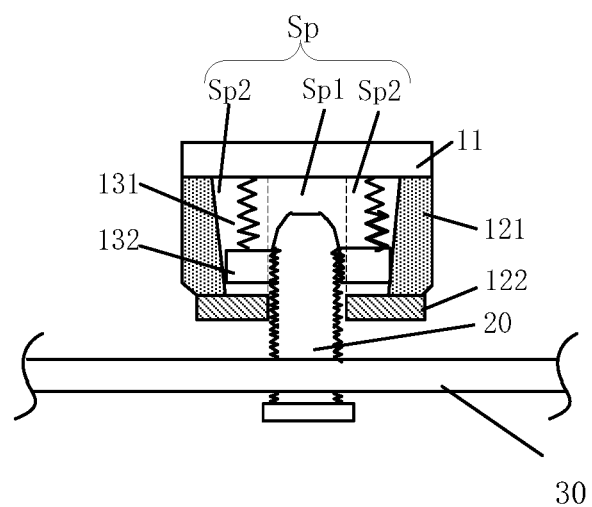

FIGS. 9A to 9C are perspective views illustrating a process for mounting a support structure and a positioning post. FIG. 9D is a schematic diagram of a box body and positioning posts thereon. FIGS. 10A to 10C are cross-sectional views illustrating a process of mounting a support structure and a positioning post. As shown in FIGS. 9A to 10C, when each positioning post 20 adopts the structure shown in FIG. 8 and each limiting member adopts the structure shown in FIG. 7, the process of mounting the support structure 11 of the display module and a corresponding positioning post 20 is as follows:

As shown in FIGS. 9A and 10A, when each positioning post 20 does not enter into a corresponding accommodating cavity Sp, a corresponding elastic member 131 is in the initial state, a corresponding limiting member 132 abuts against a corresponding cap portion 122, and an orthographic projection of the limiting member 132 on the support structure 11 overlaps with an orthographic projection of the first opening V1 of the accommodating cavity Sp on the support structure 11. When the display module and the box body 30 are mounted, the display module and a corresponding positioning post 20 are controlled to approach each other, so that the positioning post 20 enters into a corresponding accommodating cavity Sp through a corresponding first opening V1. As shown in FIG. 9B and FIG. 10B, the positioning post 20 jacks up a corresponding limiting member 132 when entering into a corresponding accommodating cavity Sp; as shown in FIG. 9C and FIG. 10C, when the positioning post 20 enters into the accommodating cavity Sp to a certain depth, the limiting members 132 are not subjected to a pushing force from the positioning post 20, but moves away from the support structure 11 under the act of an elastic force of the elastic members 131 until each limiting member 132 abuts against the first side walls of a corresponding slide part Sp2, and the thread on each limiting member 132 is engaged with the thread on a corresponding positioning post 20, so as to limit the positioning post 20. Because the mounting head portion 22 is provided on the top of each positioning post 20 and the cross-sectional area of the mounting head portion 22 is gradually reduced in a direction close to the support structure 11, the positioning post 20 can easily enter into a corresponding accommodating cavity Sp, and after the positioning post 20 and the display module do not approach each other, each limiting member 132 can smoothly slide to an end of the slide part Sp2 away from the support structure 11 along a surface of the mounting head portion 22.

Alternatively, when the display module and the positioning post 20 are mounted, a magnetic member may be used. Specifically, the magnetic member is used to attract a corresponding limiting member 132, so that the limiting member 132 overcomes the elastic force of a corresponding elastic member 131 and moves toward the support structure 11, thereby reaching a position close to the support structure 11. At this time, a corresponding elastic member 131 is in the second state. Then, the first opening of each fastener 12 on the support structure 11 directly faces a corresponding positioning post 20, and the support structure 11 and the positioning post 20 are controlled to approach each other, so that the positioning post 20 enters into a corresponding accommodating cavity Sp through the first opening. At this time, since a space of each slide part Sp2 near the support structure 11 is large, a corresponding limiting member 132 does not affect the movement of a corresponding positioning post 20. When the positioning post 20 enters into the accommodating cavity Sp to a certain depth, the limiting members 132 are not attracted. At this time, under the act of the elastic force of the elastic members 131, the limiting members 132 move away from the support structure 11 to reach a position away from the support structure 11 and abut against the first side walls of the slide parts Sp2, and the thread on each limiting member 132 is engaged with the thread on the corresponding positioning post 20 to limit the positioning post 20.

When it is necessary to separate the display module and each positioning post 20 from each other, the magnetic member is used to attract a corresponding limiting member 132, so that the limiting member 132 overcomes the elastic force of a corresponding elastic member 131 and moves toward the support structure 11, thereby reaching a position close to the support structure 11. Then, the support structure 11 and each positioning post 20 are controlled to move away from each other, so that the positioning post 20 is pulled out through the first opening.

After the display module and each positioning post 20 are mounted, if the display module is uneven, the positioning post 20 may be adjusted to ensure the evenness of the display module. Specifically, the positioning post 20 may be rotated, so that the positioning post 20 and a corresponding fastener 12 approach each other in the z direction, and a position of the display module corresponding to the positioning post 20 moves close to or away from the box body 30, so as to adjust the evenness of the display module.

It should be noted that each positioning post 20 is in a threaded connection with the box body, so that the box body is not rotated as the positioning post 20 is rotated. As shown in FIG. 9D, the box body 30 is a semi-enclosed structure, and includes a plurality of side walls 31 and a top wall 32 connected to the side wall 31; the plurality of side walls 31 and the top wall 32 together enclose a semi-open space, wherein the top wall 32 is provided with a plurality of threaded holes, and each positioning post 20 passes through a corresponding threaded hole and is in a threaded connection with the threaded hole. When the display module and the box body 30 are mounted, the top wall 32 faces the display module, and when any positioning post 20 is rotated, one end (i.e., a lower end in FIG. 9D) of the positioning post 20 away from the display module is rotated.

It should be noted that the base substrate of the single display module is made of glass or quartz, and a weight of the single display module may be below 200 g when a size of the single display module is not more than 10 inches. The elastic force of the elastic member 131 should satisfy the following condition: the plurality of elastic members 131 can support the weight of the single display module, i.e., when the box body is horizontally placed and the display module is located above the box body, even if the positioning post 20 entering into the accommodating cavity Sp is not in contact with the support structure 11 of the assembly, the plurality of elastic members 131 can also support the display module in the first state, and the deformation cannot occur, so as to prevent the display module and the box body from moving relative to each other after the display module and the box body are mounted.

Figure 11:
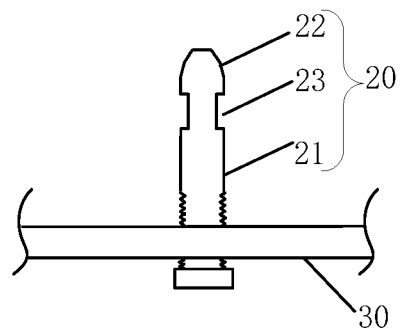
FIG. 11 is a schematic diagram of a positioning post provided in other embodiments of the present disclosure.
Figure 12A:
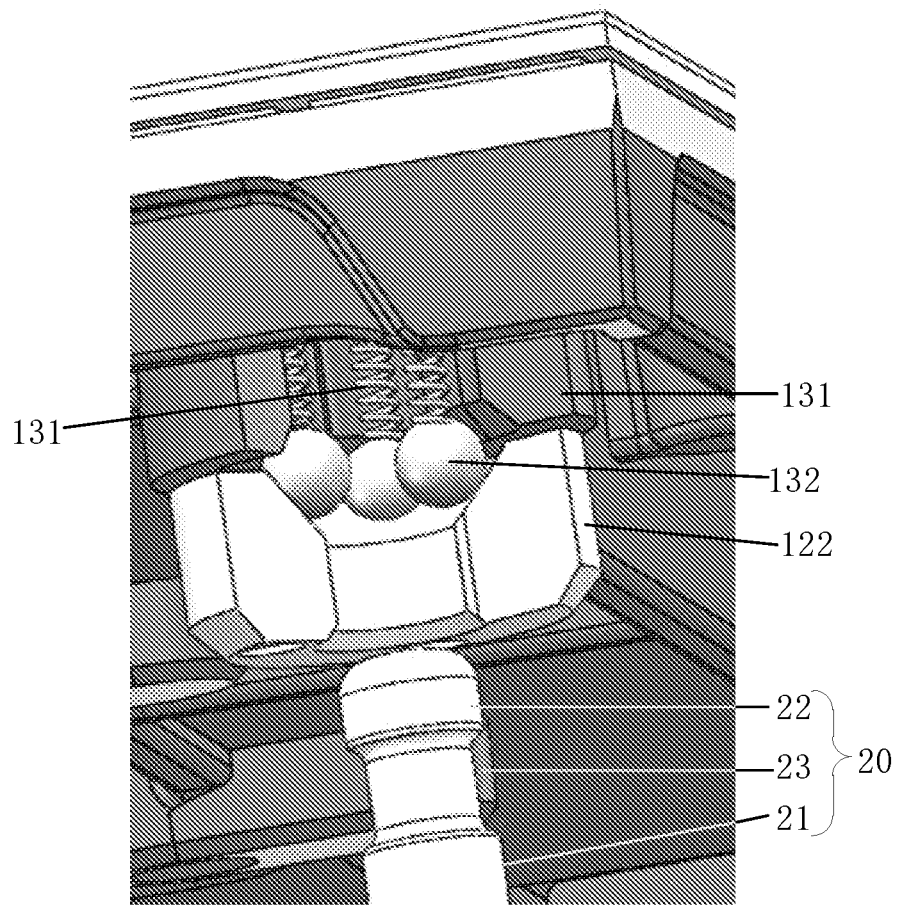
FIG. 12A is a perspective view of a fastener, a clamping module, and a positioning post provided in other embodiments of the present disclosure.
Figure 12B:
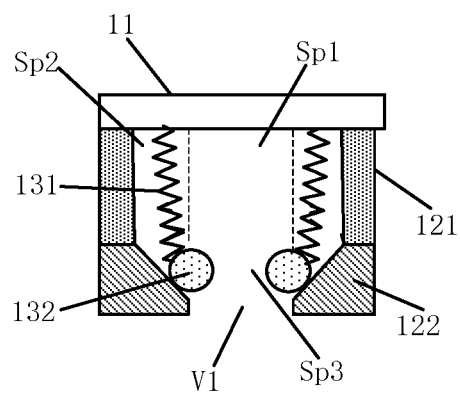
FIG. 12B is a cross-sectional view of a fastener and a clamping module provided in other embodiments of the present disclosure.

FIG. 11 is a schematic diagram of a positioning post provided in other embodiments of the present disclosure. FIG. 12A is a perspective view of a fastener, a clamping module, and a positioning post provided in other embodiments of the present disclosure. FIG. 12B is a cross-sectional view of a fastener and a clamping module provided in other embodiments of the present disclosure. Like the positioning post 20 in FIG. 8, the positioning post 20 in FIG. 11 may also include: the main body portion 21 and the mounting head portion 22; the mounting head portion 22 is positioned on a side of the main body portion 21 away from the box body, and the cross-sectional area of the mounting head portion 22 is gradually reduced in the direction away from the main body portion 21. A thread is provided on a part of the main body portion 21 away from the mounting head portion 22, so that the main body portion 21 is in a threaded connection with the box body; a limiting structure is provided on a part of the main body portion 21 close to the mounting head portion 22. Unlike the positioning post 20 in FIG. 8, in FIG. 11, the limiting structure 23 on the positioning post 20 is a groove.

When the positioning post 20 adopts the structure in FIG. 11, the fastener 12 and the clamping module 13 on the assembly may adopt the structures in FIGS. 12A to 12B. In FIGS. 12A and 12B, similarly to FIG. 7, the fastener 12 includes the cylindrical structure 121 and the cap portion 122; and each cap portion 122, a corresponding cylindrical structure 121, and a corresponding support structure 11 together enclose the accommodating cavity Sp. Each accommodating cavity Sp includes the first accommodating part Sp1 and the plurality of slide parts Sp2; each clamping module 13 includes the plurality of elastic members 131 and the plurality of limiting members 132; each slide part Sp2 is provided with one elastic member 131; the plurality of limiting members 132 are connected to the plurality of elastic members 131 in a one-to-one correspondence; each limiting member 132 is disposed on a side of a corresponding elastic member 131 away from the support structure 11, and is configured to limit a corresponding positioning post 20 in a thickness direction of the support structure 11 in cooperation with a limiting structure on the positioning post 20 when a corresponding elastic member 131 is in the first state; and is configured to be separated from the limiting structure when the elastic member 131 is in the second state. Each limiting member 132 may be a magnet or may be attracted by a magnet.

Unlike in FIG. 7, in FIGS. 12A and 12B, each limiting member 132 is not provided with a thread, but the limiting member 132 at least partially enters into the grooves, so that each clamping module 13 clamps a corresponding positioning post 20. In this case, in addition to the first accommodating part Sp1 and the plurality of slide parts Sp2, each accommodating cavity Sp further includes a second accommodating part Sp3 located on a side of the first accommodating part Sp1 away from the support structure 11, and having a second opening, a third opening, and a side wall connected therebetween. The second opening is connected to the first accommodating part Sp1 and the slide parts Sp2, and the third opening is connected to the first opening. The first accommodating part Sp1 and the slide parts Sp2 may be formed on a corresponding cylindrical structure 121, and the second accommodating part Sp3 may be formed on a corresponding cap portion 122. In the direction away from the support structure 11, a cross-sectional area of each second accommodating part Sp3 gradually decreases, so that a corresponding limiting member 132 abuts against a side wall of the second accommodating part Sp3 and at least partially enters into a corresponding groove 23 in a corresponding positioning post 20 when a corresponding elastic member 131 is in the first state.

In FIGS. 12A and 12B, each limiting member 132 may be a cylindrical, ellipsoidal, or the like. Preferably, each limiting member 132 may be spherical, so that the limiting member 132 moves along the side wall of a corresponding second accommodating part Sp3.

Figure 13:
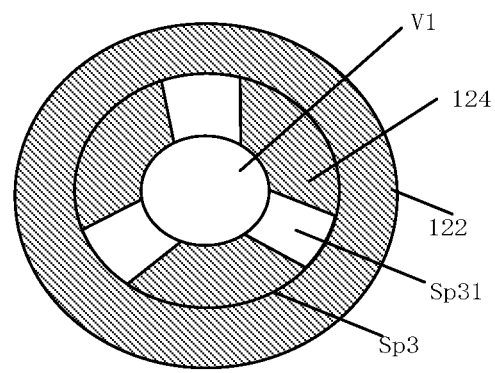
FIG. 13 is a top view of a cap portion of FIGS. 12A and 12B.

FIG. 13 is a top view of a cap portion of FIGS. 12A and 12B. As shown in FIG. 13, a plurality of spacers 124 are further provided in each second accommodating part Sp3, and divide the second accommodating part Sp3 into: a central accommodating sub-part (i.e., a portion of the second accommodating part Sp3 that directly faces a corresponding first opening V1) disposed oppositely to and connected to a corresponding first accommodating part Sp1, and a plurality of edge accommodating sub-parts Sp31 disposed oppositely to and connected to corresponding slide parts Sp2 in a one-to-one correspondence. By providing the plurality of spacers 124, it can be ensured that each limiting member 132 moves in a direction close to or away from the support structure 11 during mounting the display module and the box body, and does not move around an axis of a corresponding second accommodating part Sp3.

Figure 14A:
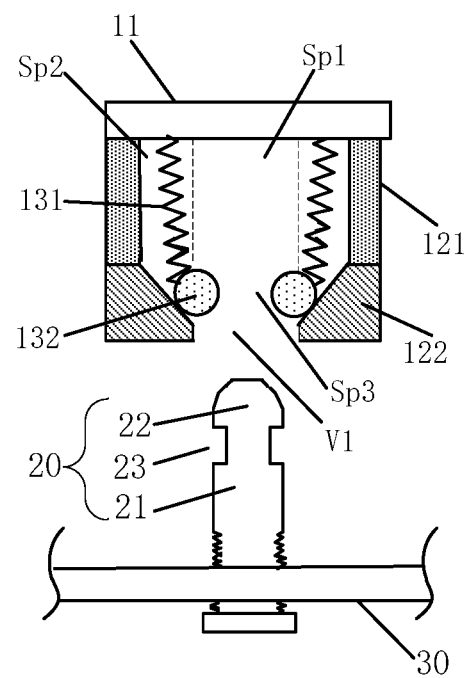
FIGS. 14A to 14C are schematic diagrams illustrating a process of mounting a display module and a box body provided in other embodiments of the present disclosure.
Figure 14B:
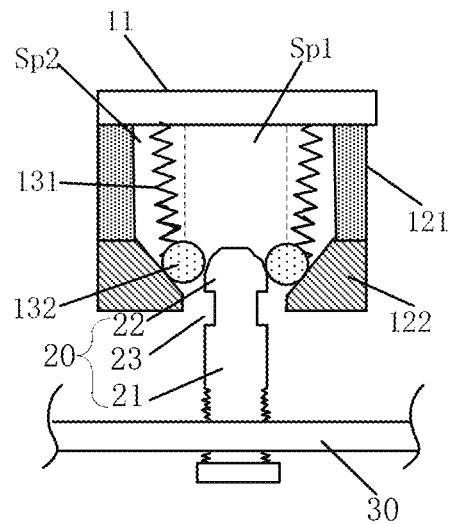
Figure 14C:
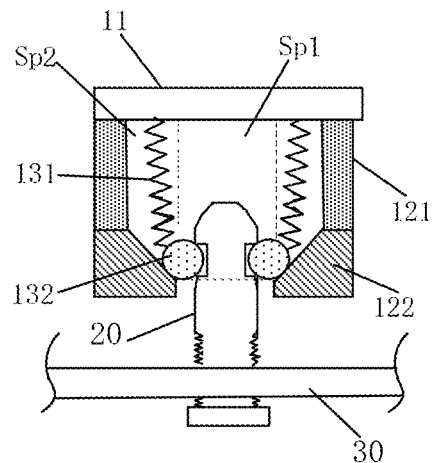

FIGS. 14A to 14C are schematic diagrams illustrating a process of mounting a display module and a box body provided in other embodiments of the present disclosure. When each positioning post 20 on the box body adopts the structure in FIG. 11, and each fastener 12 and each clamping module 13 adopt the structures in FIG. 12A, as shown in FIG. 14A, before mounting, each elastic member 131 is in the initial state, each limiting member 132 abuts against a side wall of a corresponding second accommodating part Sp3 under the act of the elastic force of a corresponding elastic member 131, and corresponding limiting members 132 are pressed against each other. When the display module and the box body are mounted, the display module and each positioning post 20 are controlled to approach each other, so that each positioning post 20 enters into a corresponding accommodating cavity Sp through a corresponding first opening. As shown in FIG. 14B, when the positioning post 20 just enters into the accommodating cavity Sp (to a smaller depth), corresponding limiting members 132 are pushed, so that the limiting members 132 overcome the elastic force of corresponding elastic members 131 and thus, moves closely to the support structure 11. As shown in FIG. 14C, when the positioning post 20 enters into the accommodating cavity Sp to a greater depth, the limiting members 132 are not pushed by the positioning post 20, but moves away from the support structure 11 under the act of the elastic force of the elastic members 131 until at least a portion of each limiting member 132 is located in a corresponding groove 23.

Alternatively, when the display module and each positioning post 20 are mounted, the magnetic member may be used. Specifically, the magnetic member is used to attract each limiting member 132, so that the limiting members 132 overcome the elastic force of the elastic members 131 and move toward the support structure 11, thereby reaching a position close to the support structure 11, and at this time, each elastic member 131 is in the second state. Then, the first opening of each fastener 12 on the support structure 11 directly face a corresponding positioning post 20, and the support structure 11 and each positioning post 20 are controlled to approach each other, so that the positioning post 20 enters into a corresponding accommodating cavity Sp through a corresponding first opening. When the positioning post 20 enters into the accommodating cavity Sp to a certain depth, the limiting members 132 are not attracted. At this time, under the act of the elastic force of the elastic members 131, the limiting members 132 move away from the support structure 11, so that the limiting members 132 are clamped into the grooves of the positioning post 20.

When it is necessary to separate the display module and the positioning posts 20 from each other, the magnetic member is used to attract the limiting members 132, so that the limiting members 132 overcomes the elastic force of the elastic members 131 and move toward the support structure 11, thereby reaching a position close to the support structure 11. Then, the support structure 11 is controlled to move away from each positioning post 20, so that the positioning post 20 is pulled out through a corresponding first opening.

In some examples, a shape and a size of each groove satisfies the following case: when entering into a corresponding groove 23, at least a part of each limiting member 132 is not completely clamped with the groove 23. At this time, each positioning post 20 may slightly move in the z direction relative to the display module. In this case, after the display module and the positioning post 20 are mounted, if the display module is uneven, the positioning post 20 may be adjusted to ensure the evenness of the display module. Specifically, the positioning post 20 may be rotated, so that the positioning post 20 and a corresponding fastener 12 approach each other in the z direction, and a position of the display module corresponding to the positioning post 20 moves close to or away from the box body 30, so as to adjust the evenness of the display module. In the positioning post 20 shown in FIG. 11, an orthographic projection of each groove 23 on the box body is a ring shape. When a part of each limiting member 132 is located in a corresponding groove 23, the rotation of a corresponding positioning post 20 is not hindered.

Figure 15:
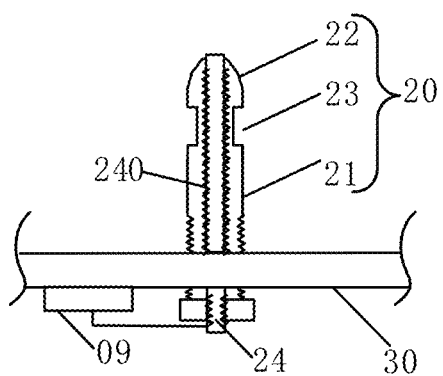
FIG. 15 is a schematic diagram of a positioning post and a regulating stem provided in still other embodiments of the present disclosure.

In other examples, the shape and the size of each groove 23 satisfies the following case: when entering into a corresponding groove 23, at least a portion of each limiting member 132 is clamped with the groove 23 to prevent a corresponding positioning post 20 from moving in the z direction relative to the display module. In this case, the evenness of the display module can be adjusted by using a regulating stem. FIG. 15 is a schematic diagram of a positioning post and a regulating stem provided in still other embodiments of the present disclosure, and the positioning post 20 shown in FIG. 15 is different from the positioning post 20 shown in FIG. 11 in that an adjusting passage 240 is provided in the positioning post 20 in FIG. 15, and penetrates through the positioning post 20 in a height direction of the positioning post 20; a regulating stem 24 is provided in the adjusting passage 240, and the regulating stem 24 is in a threaded connection with the positioning post 20. In this case, after the display module and the box body 30 are mounted, each regulating stem 24 can be rotated so that the regulating stem 24 is lifted and dropped relative to the box body 30, so as to adjust a height of the display module at a position corresponding to the regulating stem 24, and further adjust the evenness of the display module.

It should be noted that in FIGS. 9A to 9C and 12A, in order to more clearly show a structure inside the cylindrical structure 121, a part of the cylindrical structure 121 is cut away, which does not mean that an actual structure of the cylindrical structure 121 is missing.

Figure 16:
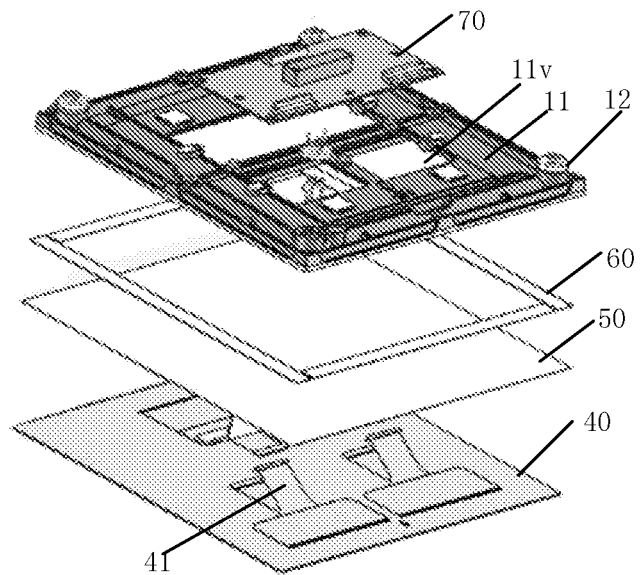
FIG. 16 is a schematic diagram of a display module provided in some embodiments of the present disclosure.

An embodiment of the present disclosure further provides a display module. FIG. 16 is a schematic diagram of the display module provided in some embodiments of the present disclosure. As shown in FIG. 16, the display module 100 includes a display substrate 40 and the assembly in the above embodiments. The display substrate 40 is located on a side of the support structure 11 away from the fasteners 12.

The display substrate 40 includes: a base substrate and a light-emitting device arranged on the base substrate, wherein the light-emitting device may be a micro light-emitting diode or the like.

As shown in FIG. 16, the display module may further include: a driving circuit board 70 and flexible circuit boards 41. The driving circuit board 70 is configured to provide signals required when displaying, such as voltage signals and data signals, for the display substrate 40. Each flexible circuit board 41 is configured to transmit a signal provided from the driving circuit board 70 to each light-emitting device. Each flexible circuit board 41 is located on a side of the base substrate away from the light-emitting device, the driving circuit board 70 is located on a side of the assembly away from the display substrate 40, the assembly is provided with hollow portions 11v, one part of each flexible circuit board 41 is electrically connected to the display substrate 40, and the other part of the flexible circuit board is connected to the driving circuit board 70 through a corresponding hollow portion 11v.

Each flexible circuit board 41 is electrically connected to the display substrate 40, that is, each flexible circuit board 41 is electrically connected to a corresponding light-emitting device. Specifically, a first binding electrode and a second binding electrode are arranged on the base substrate, the first binding electrode is located on a side of the base substrate away from the light-emitting device, the second binding electrode and the light-emitting device are located on the same side of the base substrate, the first binding electrode is connected to the light-emitting device through a signal line, the second binding electrode is connected to the first binding electrode through a connecting line, a binding region at one end of each flexible circuit board 41 is connected to the first binding electrode, and the other end of the flexible circuit board 41 is connected to the driving circuit board 70. A part of the connecting line may be located on a side of base substrate. In this way, when multiple display modules are spliced together for display, a width of a spliced seam between any adjacent display modules is less.

In addition, the number of the flexible circuit boards 41 may be multiple, for example, three. The three flexible circuit boards 41 are configured to transmit a first voltage signal, a second voltage signal, and a data signal to each light-emitting device, respectively. When the number of the flexible circuit boards 41 is multiple, the hollow portions 11v may be in a one-to-one correspondence with the flexible circuit boards 41.

As shown in FIG. 16, the display module may further include: a light-shielding sheet 50 on a side of the base substrate away from the light-emitting device. By providing the light-shielding sheet 50, the display effect can be prevented from being affected by a structure of a backlight side of the display substrate 40.

A shape of the light-shielding sheet 50 may be substantially the same as that of the base substrate. The light-shielding sheet 50 may be adhered on the base substrate. For example, an edge of the light-shielding sheet 50 is substantially flush with that of the base substrate, and an adhesive 60 is in contact with the assembly and the light-shielding sheet, respectively, thereby fixing the display substrate 40 and the light-shielding sheet 50 together with the assembly. Alternatively, the edge of the light-shielding sheet 50 is located inside the edge of the base substrate, and the adhesive 60 is in contact with the assembly and the base substrate of the display substrate 40, respectively. The light-shielding sheet 50 may cover the first binding electrode on the base substrate, and the light-shielding sheet 50 may further be provided with through holes in a one-to-one correspondence with the flexible circuit boards 41, and each flexible circuit board 41 passes through a corresponding through hole in the light-shielding sheet 50, so as to ensure that one end of the flexible circuit board 41 may be connected to the first binding electrode, and the other end is connected to the driving circuit board 70.

Optionally, a material of the light-shielding sheet 50 may be graphite. The graphite has good thermal conductivity, so that the light-shielding sheet 50 may uniformly disperse heat generated by the display substrate 40 while serving to shield the light, so as to prevent the display substrate 40 from being locally overheated, thereby improving the reliability of the display substrate.

Figure 17:
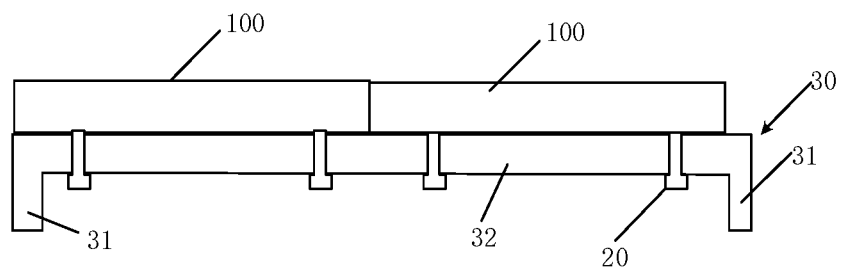
FIG. 17 is a schematic diagram of a spliced display apparatus provided in some embodiments of the present disclosure.

The embodiment of the present disclosure further provides a spliced display apparatus. FIG. 17 is a schematic diagram of a spliced display apparatus provided in some embodiments of the present disclosure. As shown in FIG. 17, the spliced display apparatus includes: a box body 30 and a plurality of display modules 100 disposed on the box body 30, wherein each display module 100 is the display module in the above embodiments.

The structure of the box body 30 is described above with reference to FIG. 9D, and is not described here again. The positioning posts 20 are disposed on a side of the box body 30 close to the display modules 100, a part of each positioning post 20 enters into a corresponding accommodating cavity through a corresponding first opening in a corresponding fastener of a corresponding display module, and a corresponding clamping module in a corresponding accommodating cavity clamps the positioning post 20.

Each positioning post 20 may adopt the structure shown in FIG. 8, 11 or 15, which is described above and is not described herein again.

In some embodiments, the spliced display apparatus may further include a driver 09 disposed on the box body. When each positioning post 20 adopts the structure shown in FIG. 8 or FIG. 11, the driver 09 is connected to the positioning post 20 and is configured to drive the positioning post 20 to rotate around an axis of the positioning post according to a driving signal, so as to drive the positioning post 20 to be lifted and dropped relative to the box body 30, thereby adjusting the evenness of the display module. When each positioning post 20 adopts the structure shown in FIG. 15, the driver 09 is connected to a corresponding regulating stem 24, and is configured to drive the regulating stem 24 to rotate around its axis according to a driving signal, so as to drive the regulating stem 24 to be lifted and dropped relative to the box body, thereby adjusting the evenness of the display module.

The driving signal may be a signal generated by a control module in the spliced display apparatus in response to an adjustment instruction of a user. For example, in the application process of the spliced display apparatus, if the display module is found to be uneven, the adjustment instruction is sent to the control module in the spliced display apparatus through a control button on a terminal or a remote control or the spliced display apparatus, so that the control module sends a driving signal to a driver according to the adjustment instruction, and control the driver to drive a corresponding positioning post 20 or a corresponding regulating stem 24 at the corresponding position to rotate according to the driving signal.

Alternatively, the spliced display apparatus may not include the above driver, and when it is necessary to adjust the evenness of the display module, a corresponding positioning post 20 or a corresponding regulating stem may be manually rotated.

The description for an assembly for a display module, a display module and a spliced display apparatus of the embodiment of the present disclosure is as above. It can be seen that in the embodiment of the present disclosure, the fasteners 12 are provided on the support structure 11 of the assembly; the clamping module 13 is provided in the accommodating cavity Sp of each fastener 12; when mounting the display module and the box body, the display module and the box body are controlled to approach each other, so that each positioning post 20 above the box body enters into a corresponding accommodating cavity Sp, and at this time, the clamping module 13 can clamp the positioning post 20, thereby realizing the mounting of the display module and the box body. In this way, the operation is convenient and fast and the mounting is convenient, and the instantaneous attraction force cannot be produced when mounting, thereby preventing the display module from being bumped and improving the product yield. In addition, when the surface of the display module is uneven, the evenness of the display module can be adjusted by adjusting the positioning posts 20.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. An assembly for a display module for assembling with a positioning post, wherein the assembly comprises:
    a support structure provided with a bearing surface and a mounting surface opposite to each other, wherein the bearing surface is used for bearing the display module;
    a fastener on the mounting surface of the support structure, wherein an accommodating cavity is provided in the fastener and comprises a first opening in a surface of the fastener away from the support structure; and
    a clamping module, which is in the accommodating cavity and used for clamping the positioning post entering into the accommodating cavity through the first opening;
    wherein the accommodating cavity comprises:
    a first accommodating part for accommodating a part of the positioning post; and
    a plurality of slide parts distributed in a circumferential direction of the first accommodating part and connected to the first accommodating part;
    wherein the clamping module comprises:
    a plurality of elastic members; wherein one elastic member is provided in each slide part; and each elastic member is configured to stretch out and draw back in a thickness direction of the support structure, and has a first state and a second state; a length of the elastic member in the first state is greater than that of the elastic member in the second state; and
    a plurality of limiting members connected to the plurality of elastic members in a one-to-one correspondence; wherein each limiting member is on a side of a corresponding elastic member away from the support structure, and is configured to limit the positioning post in the thickness direction of the support structure in cooperation with a limiting structure on the positioning post when the elastic member is in the first state; and is configured to be separated from the limiting structure when the elastic member is in the second state.

2. The assembly of claim 1, wherein the positioning post is a screw, and the limiting structure is a first thread on the positioning post; a second thread is arranged on a surface of the limiting member close to the first accommodating part; and
    each slide part comprises a first side wall opposite to the first accommodating part and is gradually close to the first accommodating part in a direction away from the support structure, so that the limiting member abuts against an end of the first side wall away from the support structure, when the elastic member is in the first state, and the first thread is engaged with the second thread.

3. The assembly of claim 1, wherein the limiting structure is a groove in the positioning post;
    the accommodating cavity further comprises: a second accommodating part on a side of the first accommodating part away from the support structure, and having a second opening, a third opening, and a side wall connected therebetween; the second opening is connected to the first accommodating part and the slide parts, and the third opening is connected to the first opening; and
    wherein a cross-sectional area of the second accommodating part gradually decreases in a direction away from the support structure, so that the limiting member abuts against the side wall of the second accommodating part and at least partially enters into the groove when the elastic member is in the first state.

4. The assembly of claim 3, wherein the limiting member has a spherical shape.

5. The assembly of claim 3, wherein a plurality of spacers are provided in the second accommodating part, and divide the second accommodating part into: a central accommodating sub-part opposite to and connected to the first accommodating part, and a plurality of edge accommodating sub-parts opposite to and connected to the plurality of slide parts in a one-to-one correspondence.

6. The assembly of claim 1, wherein the limiting member is a magnet or is attractable by a magnet.

7. The assembly of claim 1, wherein the fastener comprises:
    a cylindrical structure connected to the support structure; and
    a cap portion on a side of the cylindrical structure away from the support structure, wherein the cap portion is connected to the cylindrical structure, and encloses the accommodating cavity together with the cylindrical structure and the support structure, and the first opening of the accommodating cavity is in the cap portion.

8. The assembly of claim 7, wherein the cylindrical structure and the support structure are formed as a one-piece structure; and the cap portion is detachably connected to the cylindrical structure.

9. The assembly of claim 1, wherein the support structure is a rectangular structure, each corner of which is provided with the fastener and the clamping module.

10. A display module, comprising: a display substrate and the assembly of claim 1, wherein the display substrate is on a side of the support structure of the assembly away from the fastener.

11. A spliced display apparatus, comprising: a box body and a plurality of display modules, wherein
each of the plurality of display modules comprises: a display substrate and an assembly;
the assembly of the display module is configured for assembling with a positioning post, wherein the assembly comprises: a support structure provided with a bearing surface and a mounting surface opposite to each other, wherein the bearing surface is used for bearing the display module; a fastener on the mounting surface of the support structure, wherein an accommodating cavity is provided in the fastener and comprises a first opening in a surface of the fastener away from the support structure; and a clamping module, which is in the accommodating cavity and used for clamping the positioning post entering into the accommodating cavity through the first opening, wherein the display substrate is on a side of the support structure of the assembly away from the fastener; and
the positioning post is on a side of the box body close to the plurality of display modules, a part of the positioning post enters into the accommodating cavity through the first opening, and the clamping module clamps the positioning post;
wherein the accommodating cavity comprises:
a first accommodating part for accommodating a part of the positioning post; and
a plurality of slide parts distributed in a circumferential direction of the first accommodating part and connected to the first accommodating part;
wherein the clamping module comprises:
a plurality of elastic members; wherein one elastic member is provided in each slide part; and each elastic member is configured to stretch out and draw back in a thickness direction of the support structure, and has a first state and a second state; a length of the elastic member in the first state is greater than that of the elastic member in the second state; and
a plurality of limiting members connected to the plurality of elastic members in a one-to-one correspondence; wherein each limiting member is on a side of a corresponding elastic member away from the support structure, and is configured to limit the positioning post in the thickness direction of the support structure in cooperation with a limiting structure on the positioning post when the elastic member is in the first state; and is configured to be separated from the limiting structure when the elastic member is in the second state.

12. The spliced display apparatus of claim 11, wherein the positioning post comprises:
a main body portion connected to the box body; and
a mounting head portion on a side of the main body portion away from the box body and is fixedly connected to the main body portion; wherein a cross-sectional area of the mounting head portion decreases in a direction away from the main body portion.

13. The spliced display apparatus of claim 12, wherein the positioning post is in a threaded connection with the box body, and the spliced display apparatus further comprises:
a driver on the box body, wherein the driver is connected to the positioning post and configured to drive the positioning post to rotate around an axis of the positioning post according to a driving signal.

14. The spliced display apparatus of claim 12, wherein an adjusting passage is provided in the positioning post, and penetrates through the positioning post in a height direction of the positioning post; and a regulating stem is provided in the adjusting passage, and is in a threaded connection with the positioning post.

15. The spliced display apparatus of claim 12,
wherein the limiting structure is a groove in the positioning post;
the accommodating cavity further comprises: a second accommodating part on a side of the first accommodating part away from the support structure, and having a second opening, a third opening, and a side wall connected therebetween; the second opening is connected to the first accommodating part and the slide parts, and the third opening is connected to the first opening; and
wherein a cross-sectional area of the second accommodating part gradually decreases in a direction away from the support structure, so that the limiting member abuts against the side wall of the second accommodating part and at least partially enters into the groove when the elastic member is in the first state; and
an orthographic projection of the groove on the box body is annular.

16. The spliced display apparatus of claim 11, wherein the positioning post is in a threaded connection with the box body, and the spliced display apparatus further comprises:
a driver on the box body, wherein the driver is connected to the positioning post and configured to drive the positioning post to rotate around an axis of the positioning post according to a driving signal.

17. The spliced display apparatus of claim 11, wherein an adjusting passage is provided in the positioning post, and penetrates through the positioning post in a height direction of the positioning post; and a regulating stem is provided in the adjusting passage, and is in a threaded connection with the positioning post.

18. The spliced display apparatus of claim 17, further comprising:
a driver on the box body, wherein the driver is connected to the regulating stem and configured to drive the regulating stem to rotate around an axis of the regulating stem according to a driving signal.

19. The spliced display apparatus of claim 11,
wherein the limiting structure is a groove in the positioning post;
the accommodating cavity further comprises: a second accommodating part on a side of the first accommodating part away from the support structure, and having a second opening, a third opening, and a side wall connected therebetween; the second opening is connected to the first accommodating part and the slide parts, and the third opening is connected to the first opening; and
wherein a cross-sectional area of the second accommodating part gradually decreases in a direction away from the support structure, so that the limiting member abuts against the side wall of the second accommodating part and at least partially enters into the groove when the elastic member is in the first state; and an orthographic projection of the groove on the box body is annular.

\* \* \* \* \*